United States Patent [19]
Kim

[11] Patent Number: 5,917,855
[45] Date of Patent: Jun. 29, 1999

[54] METHOD AND APPARATUS FOR DETECTING AN ORIGINAL SIGNAL FROM A DATA STORAGE DEVICE

[75] Inventor: Sung-jin Kim, Suwon, Rep. of Korea

[73] Assignee: Samsung Electronics Co., Ltd., Kyungki-do, Rep. of Korea

[21] Appl. No.: 08/871,670

[22] Filed: Jun. 9, 1997

[30] Foreign Application Priority Data

Jun. 7, 1996 [KR] Rep. of Korea .................. 96-20342

[51] Int. Cl.⁶ .................................................. H03H 7/30
[52] U.S. Cl. ...................... 375/229; 375/229; 375/231; 375/232; 375/233
[58] Field of Search ................................ 375/229, 341, 375/232, 233, 235, 231; 348/607; 364/488, 724.19; 360/46; 369/124

[56] References Cited

U.S. PATENT DOCUMENTS

| | | | |
|---|---|---|---|
| 4,644,564 | 2/1987 | Dolivo et al. | 375/291 |
| 5,060,088 | 10/1991 | Dolivo et al. | 360/46 |
| 5,132,988 | 7/1992 | Fisher et al. | 375/233 |
| 5,572,262 | 11/1996 | Ghosh | 348/607 |
| 5,623,474 | 4/1997 | Oshio et al. | 369/124 |
| 5,781,590 | 7/1998 | Shiokawa et al. | 375/341 |

OTHER PUBLICATIONS

Cherubini, Nonlinear Self-Training Adaptive Equalization for Partial-Response System, IEEE, vol. 42, No. 2/3/4, pp. 367–376, Feb.–Apr. 1994.

Primary Examiner—Stephen Chin
Assistant Examiner—Shuwang Liu
Attorney, Agent, or Firm—Foley & Lardner

[57] ABSTRACT

A method and apparatus for detecting an original signal of a storage device uses different adaptive equalization methods, depending on a pattern of data reproduced from the data storage device. Coefficient adaptation by a partial response target equalizer (PREQ) is performed through non-linear combination according to the pattern of data reproduced from the data storage apparatus, so that the effect of the non-linear noise (which impedes the decision of the coefficient for an adaptive equalizer) is minimized. A signal having serious non-linear distortion and a high level of ISI can be detected reliably.

15 Claims, 5 Drawing Sheets

METHOD AND APPARATUS FOR DETECTING AN ORIGINAL SIGNAL FROM A DATA STORAGE DEVICE

FIELD OF THE INVENTION

The present invention provides a method and apparatus for detecting an original signal of a storage device using different adaptive equalization methods depending on the pattern of data reproduced from a data storage device.

BACKGROUND OF THE INVENTION

In detection of an original recorded signal from a signal reproduced from a storage device, if a reproduced signal includes many non-linear components, it is difficult to remove non-linear components using a conventional linear filter or to transform the reproduced signal into an intended channel form. Particularly, if the non-linearity becomes severe, performance of a system is markedly decreased.

In the case of a magnetic system amongst storage devices (e.g. magnetic system, optical system, optical-magnetic system, etc), a transition shift and a partial erasure occur and thereby non-linear components are increased. Here, a transition refers to a point where positive (+) and negative magnetic components cross, which is used for the signal detection. Thus, the transition shift is also called a bit shift or data dependent position shift. Also, the partial erasure is a phenomenon where the boundary of the left and right of each of the different signals partially collapse.

In the case of an optical system, the non-linear distortion occurs due to astigmation, spherical aberration, coma aberration, and the tilt of a disk, as well as the characteristic of a lens and focal errors.

Meanwhile, in the case of the optical magnetic system, the phenomena of the magnetic system and the optical system occur in combination to produce nonlinear distortion.

Particularly in the magnetic system, even though the influence of the transition shift is removed by the preprocessing, the effect of the partial erasure exists as before, so that it is difficult to equalize the signals using only a linear filter.

In order to equalize the interference between symbols and the non-linear distortion from the signal reproduced from the storage device, the Viterbi algorithm has been suggested. This method is achieved using the trellis transition diagram, so that the signal train can rapidly and easily be restored.

The Viterbi algorithm, simplified to be applicable to a real channel, is called the differential partial response class-IV (PR-IV) Viterbi algorithm. Although this method simplified the PR-IV Viterbi algorithm by the differential metric, the intersymbol interference still cannot be removed completely. Also, since the equalization is performed using a partial response target equalizer (PREQ), the correlation between noise itself and a signal is increased when intending to equalize a channel having a high density (e.g., extended partial response-IV (EPR-IV) to the corresponding PR-IV channel), so that the performance is lowered.

On the other hand, an adaptive PREQ is used in order to cope with a zone bit recording or the change of channel by disc rotation of constant angular velocity. However, since the adaptive PREQ adapts the least mean square (LMS) method even though it is a non-linear channel, much time is consumed in order to find the optimal equalization coefficient. Also, the coefficient is slightly disturbed by the non-linearity and the adaptive white Gaussian noise (AWGN), so the equalization system may be unstable.

Recently, intertrack interference as well as intersymbol interference (ISI) has increased causing undershoot to occur in a channel for the storage device. According to a conventional method, a linear finite impulse response (FIR) filter is adapted in order to remove the undershoot. Or a symbol-by-symbol detector is used for removing the leading undershoot as well as the trailing undershoot.

However, since these methods are based on a tentative decision, coloring of noise occurs if an FIR pole-tip filter is used to remove the leading undershoot. Also, if there is an error in the tentative decision by a tentative detector, capacity of the main Viterbi algorithm detector is deteriorated.

On the other hand, a method for achieving a decision feedback equalizer (DFE) using a feedback RAM instead of a feedback filter has been suggested. Generally, the non-linearity of the storage device is influenced by the previous data, and can nearly be removed by the feedback RAM for processing the ISI of the feedback signal. However, when reading a signal from different track of the storage device, the RAM must be updated with a large amount of data to yield a desired efficiency of reading the signals.

When adapting the feedforward equalizer according to the conventional method, the adaptation to the non-linearity is forcibly required even though it has linear properties, so that additional time is required for obtaining the optimum coefficient. Also, the coefficient converges on an arbitrary value, so it varies more. Also, theoretically the feedforward filter should be capable of changing all ISI, (i.e., linear and non-linear distortion), to the canonical form. However, if the conventional linear LMS method is used, the non-linear error and linear error function as a value for adapting the linear equalizer, so that it is difficult to equalize into the intended channel form.

Meanwhile, if a magnetic channel, in which the ISI is severe and the non-linearity by a postcursor is predominant, is implemented with a DEE using a RAM, the performance thereof is similar to the PR-IV or the EPR-IV, and problems occur related to error propagation and costs required for the implementation. Accordingly, the selection range of the DFE is much less than that of the PR-IV difference metric Viterbi algorithm.

SUMMARY OF THE INVENTION

To solve the above problems, it is an object of the present invention to provide a method and an apparatus for detecting the original signal of a storage device using different adaptive equalization methods with respect to the pattern of data reproduced from the data storage device.

According to an aspect of the present invention, there is provided a signal detection method for a data storage device in which a series of binary symbols $u_k=+1,-1$ or $Uk=0,1$ having an integer index k are recorded in a magnetic recording channel having a non-linear characteristic to obtain a signal $a(t)$, and then a digital signal $a[k]$ is obtained by sampling the signal $a(t)$, and then the digital signal $a[k]$ is adaptively equalized to be suitable for detecting an original data $û[k]$ to detect the original data, the method comprises the steps of: (a) converting the input signal $a[k]$ into a signal to be suitable for an intended channel using an adaptive partial response target equalizer; (b) adding non-linearity to training signals $t[k+1]$, $t[k]$ and $t[k-1]$ to obtain a non-linear signal $f[k]$, using the following equation, $$f(k) = t[k] - \alpha t[k+1]t[k]t[k-1] -$$
$$\beta t[k+1]t[k] - \beta t[k]t[k-1] - \gamma_t t[k-T_t] - \gamma_1 t[k-T_1]$$

where $\alpha$ is a constant representing the effect of the cubic non-linear noise, $\beta$ is a constant representing the effect of the square non-linear noise, and $\gamma_t$ and $\gamma_1$ are constants with respect to a trailing undershoot and a leading undershoot, respectively, and a $|\alpha|$, $|\beta|$, $|\gamma_t|$, $|\gamma_1|$ are equal to or less than 1; (c) convolution-operating the non-linear signal f[k] with an intended channel to generate a reference signal d[k]; (d) subtracting an output signal x[k] from the reference signal d[k] to output an error e[k]; and (e) equalizing a tap coefficient of an adaptive partial response target equalizer using the error e[k] according to a least means square (LMS) method.

Preferably, in the step (e), an equalization coefficient w[k] is obtained according to the following equation, $$w[i] = w[i] + 2\mu e[k] sgn(x[k]), i = 0,1,2, \ldots, N_e - 1$$

using the sign of the output signal x[ of the adaptive partial response target equalizer in order to use a signed LMS method as one of LMS methods.

Preferably, the step (e) using the signed LMS method includes the sub-steps for a rapid signal processing, the substeps of: outputting $2N_c + 1$ of tap coefficient trains of the adaptive partial response target equalizer from $N_c$ of all possible constant errors $e_c[0:N_c-1]$ and the current $N_w$ of tap coefficients of the adaptive partial response target equalizer using the following equations, $$w_t[0:N_w-1, I, 0] = w[0:N_w-1] + 2\mu e_c[i](1),$$
$$i = 0, 1, 2, \ldots, N_e - 1$$
$$w_t[0:N_w-1, I, 1] = w[0:N_w-1] + 2\mu e_c[i](-1),$$
$$i = 0, 1, 2, \ldots, N_e - 1$$
$$w_t[0:N_w-1, I, 2] = w[0:N_w-1]$$

and outputting one filter coefficient train decided by the sgn(x [k] and the error e[k] among $2N_c$ of tap coefficient trains according to the following rule, $$(0:N_w-1) = w_t[0:N-1,i,j]$$

where i represents an index value corresponding to a predetermined constant error $e_c[0:N_c-1$ of the current error e[k], and j is equal to 0 or 1 when the sgn(x[k]) is 1 or −1, respectively, and to the previous tap coefficient regardless of the current error e[k] when the sgn(x[k]) is 0.

Preferably, the step (b) includes the sub-steps of: outputting α when the combination of the training signals t[k+1], t[k] and t[k−1] is (1,1,1), (−1,−1,−1), (1,−1,−1) or (−1,−1,1) and −α at other combinations; and subtracting α or −α from the training signal t[k].

According to another aspect of the present invention, there is provided a signal detection apparatus for a data storage device, in which a series of binary symbols $u_k = +1$, −1 or $u_k = 0,1$ having an integer index k are recorded in a magnetic recording channel having a non-linear characteristic to obtain a signal a(t), and then a digital signal a[k] is obtained by sampling the signal a(t), and then the digital signal a[k] is adaptively equalized to be suitable for detecting an original data û[k] to detect the original data, the apparatus comprises: an adaptive partial response target equalizer for converting the input signal a[k] into a channel having an intended shape; a non-linear signal adder for adding non-linearity to training signals t k+1, t[k] and t[k−1 to obtain a non-linear signal f[k], using the following equation, $$f[k] = t[k] - \alpha t[k+1]t[k]t[k-1] -$$
$$\beta t[k+1]t[k] - \beta t[k]t[k-1] - \gamma_t t[k-T_t] - \gamma_1 t[k-T_1]$$

where $\alpha$ is a constant representing the effect of the cubic non-linear noise, $\beta$ is a constant representing the effect of the square non-linear noise, and $\gamma_t$ and $\gamma_1$ are constants with respect to a trailing undershoot and a leading undershoot, respectively, and $|\alpha|$, $|\beta|$, $|\gamma_t|$, $|\gamma_1|$ equal to or less than 1; a reference signal generator for generating a reference signal d[k] by convolution-operating the non-linear signal f[k] with an intended channel; an error detector for detecting an error by subtracting an output signal x[k] from the reference signal d(k]; and a coefficient adaptor for equalizing a tap coefficient of an adaptive partial response target equalizer using the error e[k] according to a least means square (LMS) method.

Preferably, the signal detection apparatus, for detecting the original data recorded in the data storage device from the signal output from the adaptive partial response target equalizer, further comprises: a first adder for adding an output signal r1[k] of a RAM-lookup table to an output signal r2[k] of a finite impulse response (FIR) filter to output a signal b[k]; a subtractor for subtracting the output signal b[k] of the first adder from the output signal x[k] of the adaptive partial response target equalizer to output a signal v[k]; a partial response class-IV (PR-IV) Viterbi detector for detecting the original signal using the output signal v[k] of the subtractor; means for respectively outputting a positive path and a negative path from a survival path of the PR-IV Viterbi detector; a second adder for adding the positive path to the negative path; a sign determiner for determining the sign of the signal output from the second adder as −1, 0 or +1, and outputting a signal g[k−1:k−L]; means for converting a value mapped to an address of the RAM-lookup table into an address using the signal g[k−1:k−L]; a lookup table for outputting the previously stored signal r1[k] using the converted address; and an FIR filter for outputting the signal r2[k] using the g[k−L1−1:k−L] among the output signals of the sign determining portion and a predetermined signal train u[k:k-Nu].

According to another aspect of the present invention, there is provided a method for detecting a signal from a data storage device storage an original data comprising a series of binary symbols $u_k$ having an integer index k, comprising the steps of: (a) reading a signal a(t) from the data storage device; (b) sampling the signal a(t) in order to obtain a digital signal a[k]; and (c) adaptively equalizing the digital signal a[k] to be suitable for detecting a representative original data signal û[k] corresponding to the original data by:

(1) converting the digital signal a[k] into a signal suitable for an intended channel using an adaptive partial response target equalizer;

(2) adding non-linearity to a plurality of training signals to obtain a non-linear signal f[k];

(3) convolution-operating the non-linear signal f[k] with the intended channel to generate a reference signal d[k];

(4) subtracting an output signal x[k] from the reference signal d[k] to output an error e[k]; and (5) equalizing a tap coefficient of an adaptive partial response target equalizer using the error e[k] according to a least means square (LMS) method.

Preferably, the binary symbols Uk equal one of [+1,−1] and [0,1].

Also, preferably, the plurality of training signals in step (2) comprise t[k+1], t[k] and t[k−1]; and the non-linear signal f[k] comprises the equation, $$f(k) = t[k] - \alpha t[k+1]t[k]t[k-1] -$$
$$\beta t[k+1]t[k] - \beta t[k]t[k-1] - \gamma_t t[k-T_t] - \gamma_1 t[k-T_1],$$

where $\alpha$ is a constant representing an effect of the cubic non-linear noise, $\beta$ is a constant representing an effect of a square non-linear noise, and $\gamma_t$ and $\gamma_1$ are constants with respect to a trailing undershoot and a leading undershoot, respectively, and $|\alpha|$, $|\beta|$, $|\gamma_t|$, $|\gamma_1|$ are equal to or less than 1.

Preferably, step (5) further comprises the steps of:

obtaining an equalization coefficient w[k] according to the equation, $$w[i]=w[i]+2\mu e[k]sgn(x[k]), i=0,1,2,\ldots, N_e-1;$$

wherein the adaptive partial response target equalizer uses a sign of the output signal x[k] in order to use a signed LMS method as said LMS method.

Moreover, preferably step (5) further comprises using the signed LMS method and wherein the signed LMS method includes sub-steps for rapid signal processing, the sub-steps comprising:

outputting $2N_c+1$ of tap coefficient trains of the adaptive partial response target equalizer from $N_c$ of all possible constant errors $e_c[0:N_c-1]$ and the current $N_w$ of tap coefficients of the adaptive partial response target equalizer using the equations, $$w_t[0:N_w-1, I, 0] = w[0:N_w-1] + 2\mu e_c[i](1),$$
$$i = 0, 1, 2, \ldots, N_e - 1;$$
$$w_t[0:N_w-1, I, 1] = w[0:N_w-1] + 2\mu e_c[i](-1),$$
$$i = 0, 1, 2, \ldots, N_e - 1;$$
$$w_t[0:N_w-1, I, 2] = w[0:N_w-1];$$

and outputting one filter coefficient train decided by the sgn (x[k]) and the error e[k] among $2N_c$ of tap coefficient trains according to the following rule, $$[0:N_w-1]=w_t[o:N_w-1,i,j],$$

where i represents an index value corresponding to a predetermined constant error $e_c[0:N_c-1]$ of a current value of the error e[k], and j is equal to 0 or 1 when the sgn(x[k]) is 1 or −1, respectively, and j is equal to the previous tap coefficient regardless of the current value of the error e(k] when the sgn(x[k]) is 0.

And, preferably, step (2) further comprises the sub-steps of:

outputting a when the combination of the plurality of training signals t[k+1], t[k] and t[k−1] is one of the following (1,1,1), (−1,1,−1), (1,−1,−1), and (−1, −1,1), and outputting −α at other combinations; and subtracting a α or −α from the training signal t[k].

According to another aspect of the present invention, there is provided a signal detection apparatus comprising:

an adaptive partial response target equalizer converting a digital signal a[k] into a channel having an intended shape;

a non-linear signal adder adding non-linearity to training signals to obtain a non-linear signal f[k];

a reference signal generator generating a reference signal d[k] by convolution-operating the non-linear signal f[k] with an intended channel;

an error detector subtracting an output signal x[k] from the reference signal d[k]; and a coefficient adaptor equalizing a tap coefficient of an adaptive partial response target equalizer using the error e[k] according to a least means square (LMS) method.

Preferably, the training signals comprise t[k+1], t[k] and t[k−1]; and the non-linear signal f[k] is obtained by using, $$f(k) = t[k] - \alpha t[k+1]t[k]t[k-1] -$$
$$\beta t[k+1]t[k] - \beta t[k]t[k-1] - \gamma_t t[k-T_t] - \gamma_1 t[k-T_1],$$

where $\alpha$ is a constant representing the effect of the cubic non-linear noise, $\beta$ is a constant representing the effect of the square non-linear noise, and $\gamma_t$ and $\gamma_1$ are constants with respect to a trailing undershoot and a leading undershoot, respectively, and a $|\alpha|$, $|\beta|$, $|\gamma_t|$, $|\gamma_1|$ are equal to or less than 1.

Also, preferably, the signal detection apparatus further comprises:

a first adder adding an output signal r1[k] of a RAM-lookup table to an output signal r2[k] of a finite impulse response (FIR) filter to output a signal b[k];

a subtractor subtracting the output signal b[k] of the first adder from the output signal x[k] of the adaptive partial response target equalizer to output a signal v[k];

a partial response class-IV (PR-IV) Viterbi detector detecting the original signal using the output signal v[k] of the subtractor;

an output respectively outputting a positive path and a negative path from a survival path of the PR-IV Viterbi detector;

a second adder adding the positive path to the negative path;

a sign determiner determining the sign of the signal output from the second adder as −1, 0 or +1, and outputting a signal g[k−1:k−L];

a converter converting a value mapped to an address of the RAM-lookup table into an address using the signal g[k−1:k−L];

a lookup table outputting the previously stored signal r1[k] using the converted address; and an FIR filter outputting the signal r2[k] using the g[k−L1−1:k−L] among the output signals of the sign determining portion and a predetermined signal train u[k:k−Nu].

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE PREFERRED EMBODIMENTS

Figure 1:
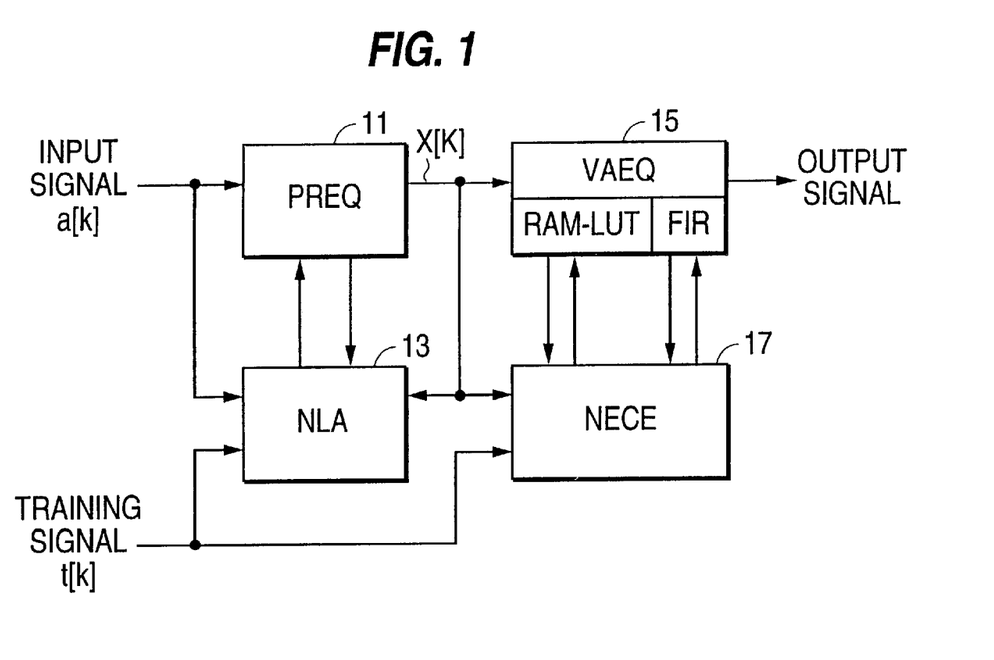
FIG. 1 is a block diagram of a signal detection apparatus for a data storage device according to the present invention.

In FIG. 1, a signal detection apparatus for a data storage device according to the present invention includes an adaptive partial response target equalizer (PREQ) 11, a non-linear least mean square (LMS) adaptator (NLA) 13, a Viterbi algorithm equalizer (VAEQ) 15 and a non-linear effective channel estimator (NECE) 17.

Figure 2:
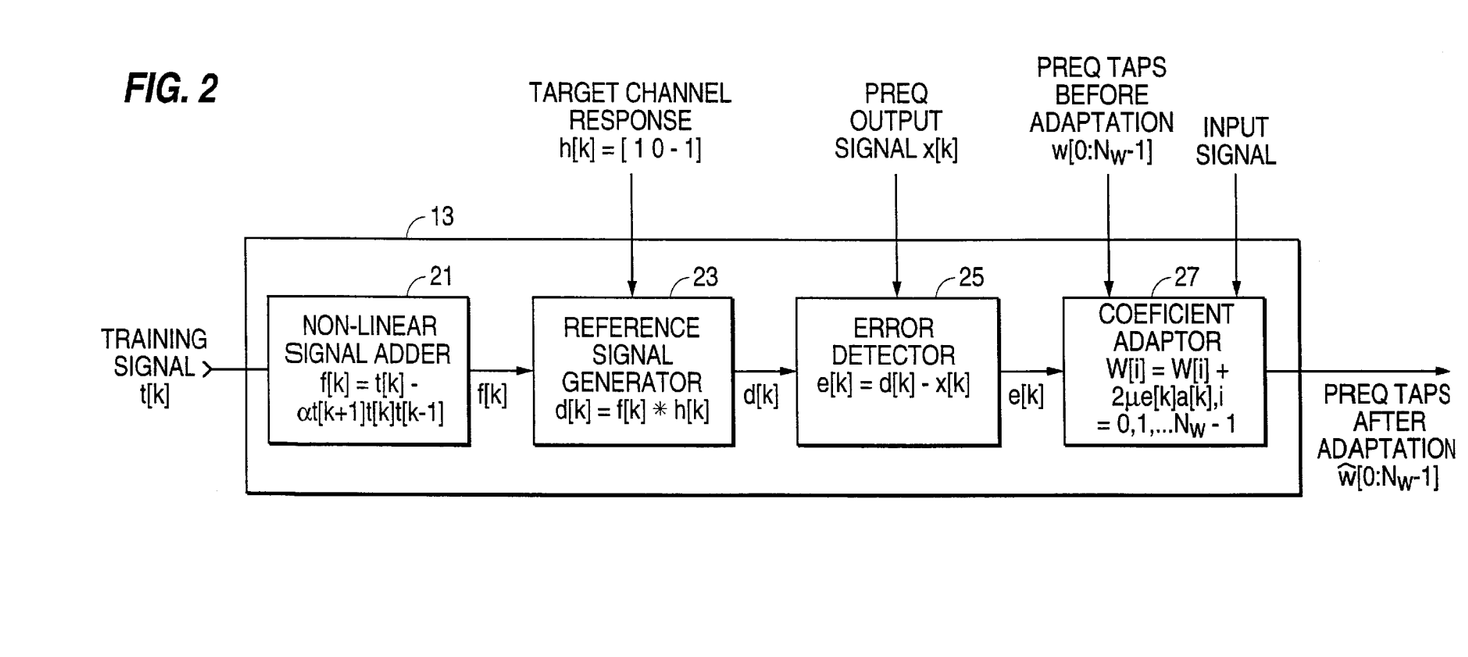
FIG. 2 is a diagram showing an example of the non-linear least mean square adaptor (NLA) shown in FIG. 1.

In FIG. 2, the NLA 13 includes a non-linear signal adder 21, a reference signal generator 23, an error detector 25 and a coefficient adaptator 27.

Figure 3:
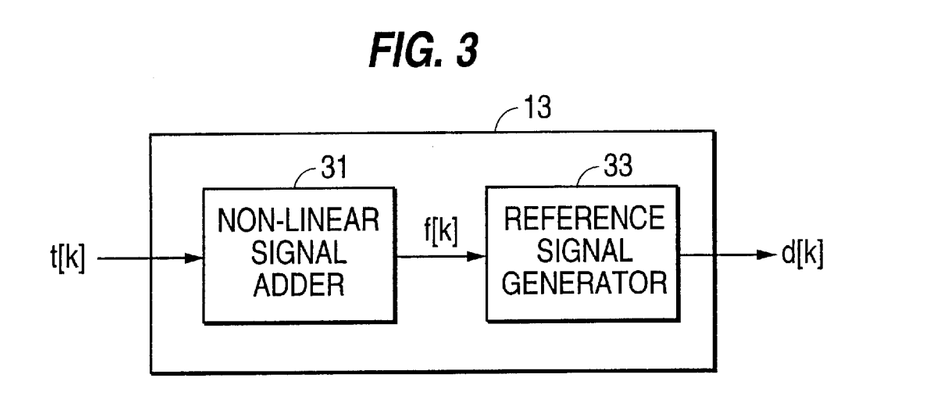
FIG. 3 is a diagram showing another embodiment of a non-linear signal adder and a reference signal generator shown in FIG. 2.

FIG. 3 shows the non-linear signal adder 31 and the reference signal generator 33 of the NLA 13 when the cubic non-linearity is considerable and the partial-response class-IV (PR-IV) Viterbi algorithm is used.

Figure 4:
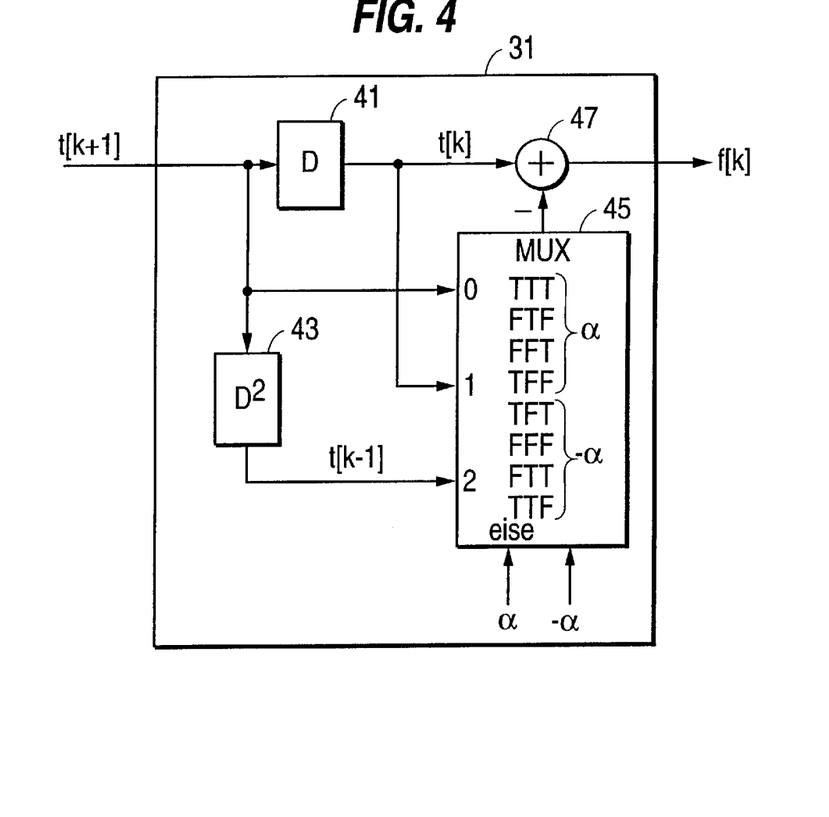
FIG. 4 is a detailed diagram of the non-linear signal adder shown in FIG. 3.

FIG. 4 shows the non-linear signal adder 31 of FIG. 3 in detail, which includes a delay elements 41 and 43, a multiplexer 45 and a subtractor 47.

Figure 5:
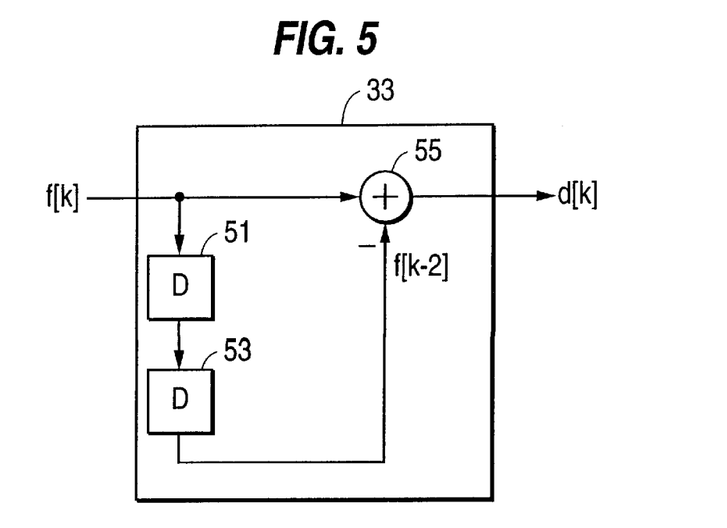
FIG. 5 is a detailed diagram of the reference signal generator shown in FIG. 3.

FIG. 5 shows the reference signal generator 33 of FIG. 3 in detail, which includes delay elements 51 and 53, and a subtractor 55.

Figure 6:
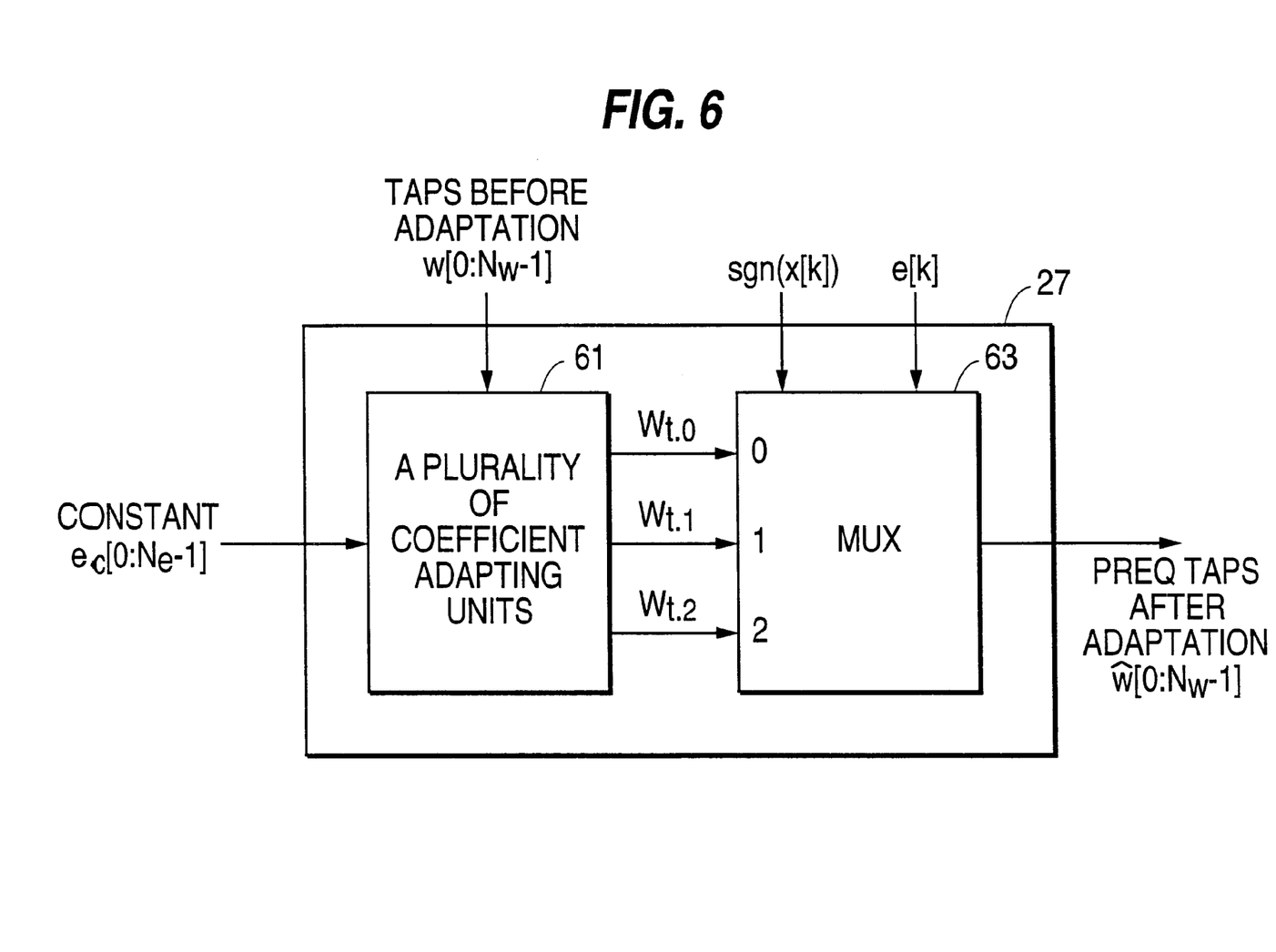
FIG. 6 is a detailed diagram of a coefficient adaptor shown in FIG. 2.

FIG. 6 shows the coefficient adaptator 27 of FIG. 2, which includes a plurality of coefficient adaptation unit 61 and a multiplexer 63.

Figure 7:
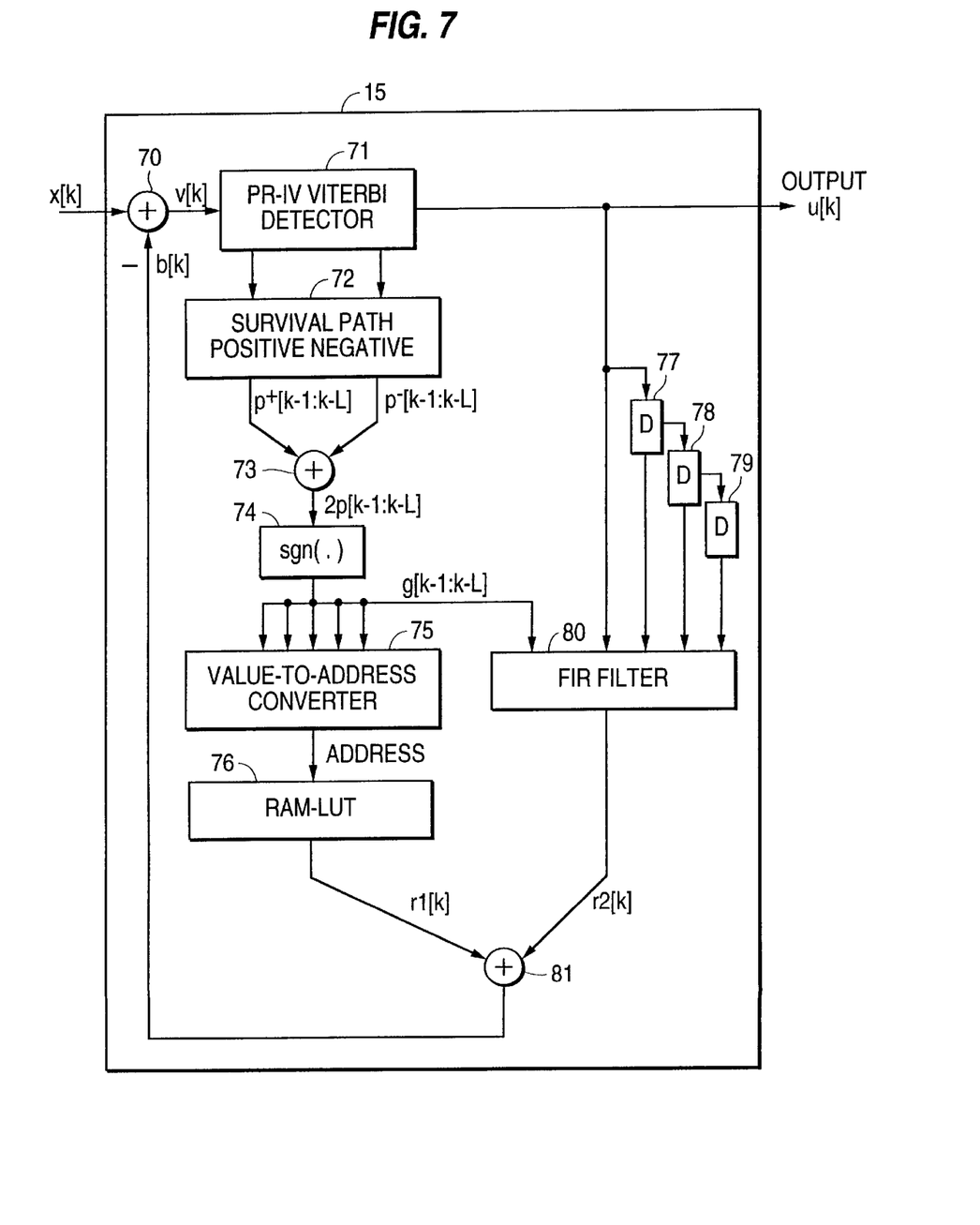
FIG. 7 is a diagram showing an example of the Viterbi algorithm equalizer (VAEQ) shown in FIG. 1.

FIG. 7 shows a preferred embodiment of the VAEQ 15 of FIG. 1. The VAEQ 15 includes a subtractor 70, an PR class-IV Viterbi detector 71, adders 73 and 81, a sign determiner (sgn) 74, a value-to-address converter 75, a finite impulse response (FIR) filter 80.

Next, the operation and effect of the present invention will now be described with reference to ° FIGS. 1 through 6.

First, the signal detection apparatus operates in the normal mode as follows.

In FIG. 1, an input signal a[km reproduced from a storage device is converted into a PR channel signal x[k] via the PREQ 11. Here, the target PR channel is $(1-D^2)$, where D represents a domain, in the case of the PR class-IV. Here, since the PREQ 11 is implemented using linear feedforward and so on, it is difficult to exactly match the target to $(1-D^2)$, and remove the nonlinear ISI. Thus, the VAEQ 15 removes the remaining ISI by feeding back the data decided at a survival path or a Viterbi algorithm detector. As a result, the next input signal can be detected reliably. Particularly, in the case of the PR-IV channel, a trellis merge immediately occurs with respect to a high-frequency input signal and the signal processing using the Viterbi algorithm occurs rapidly. Thus, the feedback is performed using the processed signal, and the remaining ISI is effectively removed.

The NECE 17 is a general channel measurement device using a least means square (LMS) method, for (a) measuring the remaining linear and nonlinear ISI (except the target PR) remaining after the conversion to the target channel using the adaptive PREQ 11, and the intentionally remaining ISI, and (b) transferring the result to the VAEQ 15.

In FIG. 7, in order to find the merged portion of the survival path made by the PR-IV Viterbi detector 71, a positive/negative survival path 72 is added by the adder 73, and then only sign such as 0, +1 or −1 are obtained by the sgn 74. Five of the output symbols are converted to an address in a RAM-lookup table (RAM-LUT) 76 by the value-to-address converter 75. The output value of the RAM-LUT 76 (obtained using the address) is added to the output value of the FIR filter 80 (obtained with respect to the remaining path output symbol and the decided signal train) by the adder 81, and then the result is subtracted at an input end of the VAEQ 15.

On the other hand, in the training mode, the signal detection apparatus according to the present invention operates as follows.

In FIG. 1, a training sequence t(k) and the input signal a[k] and the output signal x[k] of the PREQ 11 are used to adapt the PREQ 11 to be optimal with respect to the varied channels. The input signal a[k] is converted into the signal x[k] by the PREQ 11, which is suitable for the VAEQ 15. The signal x[k] is input to the NLA 13 and then used, together with the signals t[k] and a[k], for calculating an equalization error of the PREQ 11. The NLA 13 uses the error value to adapt tap coefficients of the PREQ 11 according to the general LMS or a signed LMS method.

FIG. 2 shows a preferred embodiment of the NLA 13 shown in FIG. 1. The training signal t[k] becomes a non-linear signal f[k] by the non-linear signal adder 21. In order to remove the effects of the linear noise and the undershoot, the non-linear signal f[k] is determined using equation (1).

$$f(t[k-1:k+1])=t[k]-\alpha t[k+1]t[k]t(k-1] \tag{1}$$

Here, $\alpha$ is the constant of the effect of the cubic non-linear noise.

For testing the theoretical accuracy, the optimum coefficients are calculated with respect to the conventional case where $\alpha=0$ and the proposed case where $\alpha=0.2$ using the LMS method. As a result, the overall power ratio is 1:1.04, which is not significant. However, it is difficult to find the exact solution without the proposed non-linear process due to the effect of noise. Also, the variance is not good if the solution is obtained with a time lapse, which reduces the stability of the system.

The hard disk driver (HDD) is affected by the intertrack interference (ITI) and the head unless the effect of the undershoot is removed by special means. Thus, if the effect of the undershoot is not removed or if the effect of a square non-linear noise is significant, the training signal f(k) should be set by the following method. Here, the degree of the effect of the cubic noise, square noise, and undershoot can be calculated from the MLS channel measurement by receiving a pseudo random sequence, as shown in equation (2).

$$f[k] = t[k] - \alpha t[k+1]t[k]t[k-1] - \\ \beta t[k+1]t[k] - \beta t[k]t[k-1] - \gamma_t t[k-T_t] - \gamma_1 t[k-T_1] \tag{2}$$

In equation (2), $\beta$ is a constant representing the effect of the square nonlinear noise, and $\gamma_t$ and $\gamma_1$ are constants with respect to a trailing undershoot and a leading undershoot, respectively.

On the other hand, h[k] is a channel response signal as a target of the PREQ 11, and output is $(1-D_2)$ in the case of the PR-IV Viterbi algorithm.

The signals f[k] and h[k] become a reference signal d[k] by means of the reference signal generator 23. The reference signal d[k] is obtained by the following equation (3) in the case of the PR-IV Viterbi algorithm.

$$d[k]=f(t[k-pLk+p]*h[k] \quad (3)$$

In the equation (3), * represents a convolution operator, and h[k] is 1, 0 or −1 when k=0, 1 or 2, respectively.

The output signal e[k] of the error detector 25 is determined by equation (4).

$$e[k]=d[k]-x[k] \quad (4)$$

The signal e[k] is input to the coefficient adaptator 27 together with the current equalizer coefficient w[k] and the input signal a[k]. The coefficient adaptator 27 adapts w[k] into w[k] using the general LMS method and a signed or highspeed coefficient adaptation means, and outputs the result.

FIG. 3 shows another embodiment of the non-linear signal adder 31 and the reference signal generator 33 when the cubic non-linear noise is considerable and the PR-IV Viterbi algorithm is used. The nonlinear signal adder 31 converts the training signal t(k) into a signal f[k] according to equation (5).

$$f[k]=t[k]-\alpha t[k+1]t[k]t(k-1) \quad (5)$$

The reference signal generator 33 receives the output signal f[k] of the non-linear signal adder 31 and outputs a reference signal d[k] according to equation (6).

$$d[k]=f[k]-f[k-2] \quad (6)$$

FIG. 4 shows the non-linear signal adder 31 of FIG. 3 in detail. An input signal t(k+1) is input to the multiplexer 45 via the delay elements 41 and 43, and then the input signal t[k+1] is subtracted from the signal t(k) by the subtractor 47 to output a signal f[k]. The multiplexer 45 outputs α or −α according to Table 1.

TABLE 1

| Input | | | |
|---|---|---|---|
| t[k + 1] | t[k] | t[k − 1] | Output |
| 1 | 1 | 1 | α |
| −1 | 1 | −1 | |
| −1 | −1 | 1 | |
| 1 | −1 | −1 | |
| 1 | −1 | 1 | α |
| −1 | −1 | −1 | |
| −1 | 1 | −1 | |

FIG. 5 shows the reference signal generator 33 of FIG. 3 in detail. The subtractor 55 subtracts f[k−2] from f[k] to output d[k]. Here, f[k−2] is obtained from f[k] by means of the delay elements 51 and 53.

FIG. 6 shows the coefficient adaptator 27 in detail. In the case of the HDD requiring a high-speed signal process, coefficient adaptation values with respect to all errors are previously calculated by the plurality of coefficient adaptation units 61, and then the results are output via the multiplexer 63 just after the error values are calculated. This is performed using a look-a-head signal processing method, where possible all error constants $e_c(0:N_e-1)$ and the current tap value $w[0:N_w-1]$ of the PREQ 11 are applied to the plurality of coefficient adaptation units 61 in order to output the all possible output coefficients $w_t(0:2N_e,N_w-1)$ as shown in equation (6).

$$w_t[0:N_w-1, I, 0] = w[0:N_w-1] + 2\mu e_c[i](1), \quad (6)$$

$$i = 0, 1, 2, ..., N_e - 1$$

$$w_t[0:N_w-1, I, 1] = w[0:N_w-1] + 2\mu e_c[i](-1),$$

$$i = 0, 1, 2, ..., N_e - 1$$

$$w_t[0:N_w-1, I, 2] = w[0:N_w-1]$$

In equation (6) above, $N_c$ represents the number of the all possible errors, and $N_w$ represents the tap number of the PREQ 11.

On the other hand, sgn(x[k]) is a function for taking only the sign of the x[k1], providing only three values of 0, 1 and −1. Thus, the number of outputs of the coefficient adaptation units 61 is equal to $2N_e$ according to the function of sgn(x[k]). Then, the newly updated w[k] is output by the multiplexer 63 by the combination of e[k] and x[k].

As described above, in the signal detection method for a data storage device and apparatus therefor according to the present invention, the coefficient adaptation of the PREQ is performed by the non-linear combination according to the pattern of the reproduced data, so that the effect of the non-linear noise (which prevents the determination of the coefficient for an adaptive equalizer) is minimized. Accordingly, a signal having serious non-linear distortion and much ISI can be detected with high reliability.

Particularly, the time required for the coefficient adaptation can be minimized, and the variance after the convergence is smaller (compared with the conventional linear LMS method), so that the PREQ system is equalized.

Also, when the VAEQ is installed for removing the trailing undershoot, the effect of the 1[1, which prevents the equalization coefficient adaptation of the PREQ, can be minimized. Also, since the equalization is performed using the adaptation method, the cubic non-linear characteristic is not shifted to another order of non-linear noise, so that the non-linearity can be effectively removed using fewer lookup tables in the VAEQ.

Also, when using RLL 8/9(0,4) code, the depth of the PR class-IV Viterbi algorithm is less, so that the DFE based on the determined signal train effectively removes the undershoot generated due to the short distance between HDD tracks, and the characteristic of the head. Here, the determined signal train includes the data output from the Viterbi algorithm to the outside, and detection data which is merged in the survival path and exists equally in both positive and negative survival paths. Also, a part of the feedback portion is processed by the RAM, so that the non-linear distortion as well as the linear distortion can reliably be removed.

The Korean Patent Application Serial No. 96-20342, filed on Jun. 7, 1996, is incorporated by reference herein.

What is claimed is:

1. A signal detection method for a data storage device, in which a series of binary symbols $u_k=+1$, −1 or $u_k=0$, 1 having an integer index k are recorded in a magnetic recording channel having a non-linear characteristic to obtain a signal a(t), after which a digital signal a[k] is obtained by sampling the signal a(t), after which the digital signal a[k] is adaptively equalized to be suitable for detecting an original data û[k] to detect the original data, comprising the steps of:

(a) converting the input signal a[k] into a signal to be suitable for an intended channel using an adaptive partial response target equalizer;

(b) adding non-linearity to training signals t[k+1], t[k] and t[k-1] to obtain a non-linear signal f[k], using the following equation, $$f[k] = t[k] - \alpha t[k+1]t[k]t[k-1] -$$
$$\beta t[k+1]t[k] - \beta t[k]t[k-1] - \gamma_t t[k-T_t] - \gamma_1 t[k-T_1]$$

where $\alpha$ is a constant representing the effect of the cubic non-linear noise, $\beta$ is a constant representing the effect of the square non-linear noise, and $\gamma_t$ and $\gamma_1$ are constants with respect to a trailing undershoot and a leading undershoot, respectively, and $|\alpha|$, $|\beta|$, $|\gamma_t|$, $|\gamma_1|$ are equal to or less than 1;

(c) convolution-operating the non-linear signal f[k] with an intended channel to generate a reference signal d[k];

(d) subtracting an output signal x[k] from the reference signal d[k] to output an error e[k]; and (e) equalizing a tap coefficient of an adaptive partial response target equalizer using the error e[k] according to a least means square (LMS) method.

2. The signal detection method as claimed in claim 1, wherein in step (e), an equalization coefficient w[k] is obtained according to the following equation, $$w[i] = w[i] + 2\mu k[k] sgn(x[k]), i=0,1,2, \ldots, N_c-1$$

using the sign of the output signal x[k] of the adaptive partial response target equalizer in order to use a signed LMS method as one of LMS methods.

3. The signal detection method as claimed in claim 2, wherein step (e) using the signed LMS method includes sub-steps for a rapid signal processing, the sub-steps comprising:

outputting $2N_c+1$ of tap coefficient trains of the adaptive partial response target equalizer from $N_c$ of all possible constant errors $e_c[0:N_c-1$ and the current $N_w$ of tap coefficients of the adaptive partial response target equalizer using the following equations, $$w_t[0:N_w-1, I, 0] = w[0:N_w-1] + 2\mu e_c[i](1),$$
$$i = 0, 1, 2, \ldots, N_e - 1$$
$$w_t[0:N_w-1, I, 1] = w[0:N_w-1] + 2\mu e_c[i](-1),$$
$$i = 0, 1, 2, \ldots, N_e - 1$$
$$w_t[0:N_w-1, I, 2] = w[0:N_w-1]; \text{ and}$$

outputting one filter coefficient train decided by the sgn ([k]) and the error e[k] among $2N_c$ of tap coefficient trains according to the following rule, $$[0:N_w-1] = w_t[0:N_w-1, i,j],$$

where i represents an index value corresponding to a predetermined constant error $e_c[0:N_c-1]$ of the current error e[k], and j is equal to 0 or 1 when the sgn(x[k]) is 1 or -1, respectively, or j is equal to the previous tap coefficient regardless of the current error e(k) when the sgn(x[k]) is 0.

4. The signal detection method as claimed in claim 1, wherein step (b) includes the sub-steps of:

outputting $\alpha$ when the combination of the training signals t[k+1], t[k] and t[k-1] is (1,1,1), (-1,1,-1), (1,-1,-1) or (-1,-1,1), and outputting $-\alpha$ at other combinations; and subtracting $\alpha$ or $-\alpha$ from the training signal t[k].

5. The signal detection apparatus for a data storage device, in which a series of binary symbols $u_k=+1$, $-1$ or $u_k=0, 1$ having an integer index k are recorded in a magnetic recording channel having a non-linear characteristic to obtain a signal a(t), after which a digital signal a[k] is obtained by sampling the signal a(t), after which the digital signal a[k] is adaptively equalized to be suitable for detecting an original data û[k] to detect the original data, the apparatus comprising:

an adaptive partial response target equalizer converting the input signal a[k] into a channel having an intended shape;

a non-linear signal adder adding non-linearity to training signals t[k+1, t(k) and t[k-1] to obtain a non-linear signal f[k], using the following equation, $$f[k] = t[k] - \alpha t[k+1]t[k]t[k-1] -$$
$$\beta t[k+1]t[k] - \beta t[k]t[k-1] - \gamma_t t[k-T_t] - \gamma_1 t[k-T_1],$$

where $\alpha$ is a constant representing the effect of cubic non-linear noise, $\beta$ is a constant representing the effect of square non-linear noise, and $\gamma_t$ and $\gamma_1$ are constants with respect to a trailing undershoot and a leading undershoot, respectively, and $|\alpha|$, $|\beta|$, $|\gamma_t|$, $|\gamma_1|$ are equal to or less than 1;

a reference signal generator generating a reference signal d(k) by convolution-operating the non-linear signal f[k] with an intended channel;

an error detector detecting an error by subtracting an output signal x[k] from the reference signal d[k]; and a coefficient adaptor equalizing a tap coefficient of an adaptive partial response target equalizer using the error e[k] according to a least means square (LMS) method.

6. The signal detection apparatus as claimed in claim 5, detecting the original data recorded in the data storage device from the signal output from the adaptive partial response target equalizer, further comprising:

a first adder adding an output signal r1[k] of a RAM-lookup table to an output signal r2[k] of a finite impulse response (FIR) filter to output a signal b[k];

a subtractor subtracting the output signal b[k] of the first adder from the output signal x[k] of the adaptive partial response target equalizer to output a signal v[k];

a partial response class-IV (PR-IV) Viterbi detector detecting the original signal using the output signal v[k] of the subtractor;

an output respectively outputting a positive path and a negative path from a survival path of the PR-IV Viterbi detector;

a second adder adding the positive path to the negative path;

a sign determiner determining the sign of the signal output from the second adder as -1, 0 or +1, and outputting a signal g[k-1:k-L];

a converter converting a value mapped to an address of the RAM-lookup table into an address using the signal g[k-1:k-L];

a lookup table outputting the previously stored signal r1[k] using the converted address; and an FIR filter outputting the signal r2[k] using the g[k-L1-1:k-L] among the output signals of the sign determining portion and a predetermined signal train u[k:k-Nu].

7. A method for detecting a signal from a data storage device storing an original data comprising a series of binary symbols $u_k$ having an integer index k, comprising the steps of:

(a) reading a signal a(t) from the data storage device;

(b) sampling the signal a(t) in order to obtain a digital signal a[k]; and (c) adaptively equalizing the digital signal a[k] to be suitable for detecting a representative original data signal û[k] corresponding to the original data by:

(1) converting the digital signal a[k] into a signal suitable for an intended channel using an adaptive partial response target equalizer;

(2) adding non-linearity to a plurality of training signals to obtain a non-linear signal f[k];

(3) convolution-operating the non-linear signal f[k] with the intended channel to generate a reference signal d[k];

(4) subtracting an output signal x[k] from the reference signal d[k] to output an error e[k]; and (5) equalizing a tap coefficient of an adaptive partial response target equalizer using the error e[k] according to a least means square (LMS) method.

8. The method for detecting a signal according to claim 7, wherein the binary symbols $u_k$ equal one of [+1,−1] and [0,1].

9. The method for detecting a signal according to claim 7, wherein the plurality of training signals in step (2) comprise t[k+1], t[k] and t[k−1]; and wherein the non-linear signal f[k] comprises the equation, $$f[k] = t[k] - \alpha t[k+1]t[k]t[k-1] - \beta t[k+1]t[k] - \beta t[k]t[k-1] - \gamma_t t[k-T_t] - \gamma_1 t[k-T_1],$$

where α is a constant representing an effect of the cubic non-linear noise, β is a constant representing an effect of a square non-linear noise, and $\gamma_t$ and $\gamma_1$ are constants with respect to a trailing undershoot and a leading undershoot, respectively, and $|\alpha|, |\beta|, |\gamma_t|, |\gamma_1|$ are equal to or less than 1.

10. The method for detecting a signal according to claim 7, wherein step (5) further comprises the steps of:

obtaining an equalization coefficient w[k] according to the equation, $$w[i]=w[i]+2\mu e[k]sgn(x[k]), i=0,1,2,\ldots,N_c-1;$$

wherein the adaptive partial response target equalizer uses a sign of the output signal x[k] in order to use a signed LMS method as said LMS method.

11. The signal detection method as claimed in claim 10, wherein step (5) further comprises using the signed LMS method and wherein the signed LMS method includes sub-steps for rapid signal processing, the sub-steps comprising:

outputting $2N_c+1$ of tap coefficient trains of the adaptive partial response target equalizer from $N_c$ of all possible constant errors $e_c[0:N_c-1]$ and the current $N_w$ of tap coefficients of the adaptive partial response target equalizer using the equations, $$w_t[0:N_w-1, I, 0] = w[0:N_w-1] + 2\mu e_c[i](1),$$

$i = 0, 1, 2, \ldots, N_e - 1;$ $$w_t[0:N_w-1, I, 1] = w[0:N_w-1] + 2\mu e_c[i](-1),$$

$i = 0, 1, 2, \ldots, N_e - 1;$ $$w_t[0:N_w-1, I, 2] = w[0:N_w-1]; \text{ and}$$

outputting one filter coefficient train decided by the sgn (x[k]) and the error e[k] among $2N_c$ of tap coefficient trains according to the following rule, $$[0:N_w-1]=w_t[0:N_w-1, k,j],$$

where i represents an index value corresponding to a predetermined constant error $e_c[0:N_c-1]$ of a current value of the error e[k], and j is equal to 0 or 1 when the sgn(x[k]) is 1 or −1, respectively, and j is equal to the previous tap coefficient regardless of the current value of the error e(k) when the sgn(x[k]) is 0.

12. The signal detection method as claimed in claim 7, wherein step (2) further comprises the sub-steps of:

outputting α when the combination of the plurality of training signals t[k+1], t[k] and t[k−1] is one of the following (1,1,1), (−1,1,−1), (1,−1,−1), and (−1,−1, 1), and outputting −α at other combinations; and subtracting α or −α from the training signal t[k].

13. The signal detection apparatus, comprising:

an adaptive partial response target equalizer converting a digital signal a[k] into a signal suitably shaped for an intended channel;

a non-linear signal adder adding non-linearity to training signals to obtain a non-linear signal f[k];

a reference signal generator generating a reference signal d[k] by convolution-operating the non-linear signal f[k] with an intended channel;

an error detector subtracting an output signal x[k] of said adaptive partial response target equalizer from the reference signal d[k] to form an error signal e[k]; and a coefficient adaptor equalizing a tap coefficient of an adaptive partial response target equalizer using the error e[k] according to a least means square (LMS) method.

14. The signal detection apparatus according to claim 13, wherein the training signals comprise t[k+1], t(k) and t[k−1]; and wherein the non-linear signal f[k] is obtained by using the equation, $$f[k] = t[k] - \alpha t[k+1]t[k]t[k-1] - \beta t[k+1]t[k] - \beta t[k]t[k-1] - \gamma_t t[k-T_t] - \gamma_1 t[k-T_1],$$

where α is a constant representing the effect of the cubic non-linear noise, β is a constant representing the effect of the square non-linear noise, and $\gamma_t$ and $\gamma_1$ are constants with respect to a trailing undershoot and a leading undershoot, respectively, and $|\alpha|, |\beta|, |\gamma_t|, |\gamma_1|$ are equal to or less than 1.

15. The signal detection apparatus according to claim 13, further comprising:

a first adder adding an output signal r1[k] of a RAM-lookup table to an output signal r2[k] of a finite impulse response (FIR) filter to output a signal b[k];

a subtractor subtracting the output signal b[k] of the first adder from the output signal x[k] of the adaptive partial response target equalizer to output a signal v[k];

a partial response class-IV (PR-IV) Viterbi detector detecting the original signal using the output signal v[k] of the subtractor;

an output respectively outputting a positive path and a negative path from a survival path of the PR-IV Viterbi detector;

a second adder adding the positive path to the negative path;

a sign determiner determining the sign of the signal output from the second adder as −1, 0 or +1, and outputting a signal g[k−1:k−L];

a converter converting a value mapped to an address of the RAM-lookup table into an address using the signal g[k−1:k−L];

a lookup table outputting the previously stored signal r1[k] using the converted address; and n FIR filter outputting the signal r2[k] using the g[k−L1−1:k−L] among the output signals of the sign determining portion and a predetermined signal train u[k:k−Nu].

* * * * *